(12) United States Patent
Ito et al.

(10) Patent No.: US 12,745,457 B2
(45) Date of Patent: Sep. 22, 2026

(54) SUPPORT SUBSTRATE FOR PASSIVE ELECTRONIC COMPONENT, PASSIVE ELECTRONIC COMPONENT, SEMICONDUCTOR DEVICE, MATCHING CIRCUIT, AND FILTER CIRCUIT

(71) Applicant: Murata Manufacturing Co., Ltd., Nagaokakyo (JP)

(72) Inventors: Korekiyo Ito, Nagaokakyo (JP); Masatomi Harada, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 373 days.

(21) Appl. No.: 18/497,020

(22) Filed: Oct. 30, 2023

(65) Prior Publication Data

US 2024/0063224 A1 Feb. 22, 2024

Related U.S. Application Data

(63) Continuation of application No. PCT/JP2022/019621, filed on May 9, 2022.

(30) Foreign Application Priority Data

May 10, 2021 (JP) ................................ 2021-079850

(51) Int. Cl.
*H10D 86/00* (2025.01)
*H01G 4/33* (2006.01)
(Continued)

(52) U.S. Cl.
CPC ............ *H10D 86/201* (2025.01); *H01G 4/33* (2013.01); *H03H 7/0115* (2013.01); *H03H 7/38* (2013.01);
(Continued)

(58) Field of Classification Search
CPC ........ H10D 86/201; H10D 1/68; H10D 84/00; H10D 84/038; H01G 4/33; H03H 7/0115;
(Continued)

(56) References Cited

U.S. PATENT DOCUMENTS 5,767,548 A * 6/1998 Wondrak .............. H10D 8/411 257/E29.328
6,400,252 B1 6/2002 Smith et al.
(Continued)

FOREIGN PATENT DOCUMENTS

JP 2002530868 A 9/2002
JP 2007258713 A 10/2007
(Continued)

OTHER PUBLICATIONS

International Search Report in PCT/JP2022/019621, mailed Jul. 26, 2022, 3 pages.

*Primary Examiner* — Julia Slutsker
(74) *Attorney, Agent, or Firm* — ArentFox Schiff LLP

(57) ABSTRACT

A support substrate for a passive electronic component, the support substrate including: a semiconductor substrate; a charge trap layer on the semiconductor substrate and having a higher crystal defect density than the semiconductor substrate; and an insulating layer on the charge trap layer. In a first aspect, the insulating layer is composed of silicon nitride, and an atomic concentration ratio of N to a total amount of Si and N in the insulating layer is not greater than 45 atom %. In a second aspect, the insulating layer includes a first insulating layer on the charge trap layer; and a second insulating layer on the first insulating layer, wherein a first fixed charge within the first insulating layer and a second fixed charge within the second insulating layer have opposite polarities, and the first insulating layer has a thickness of not less than 0.5 nm and not greater than 3 nm.

20 Claims, 8 Drawing Sheets

(51) Int. Cl.

| | |
|---|---|
| ***H03H 7/01*** | (2006.01) |
| ***H03H 7/38*** | (2006.01) |
| ***H03H 9/02*** | (2006.01) |
| ***H03H 9/17*** | (2006.01) |
| ***H03H 9/25*** | (2006.01) |
| ***H10D 1/68*** | (2025.01) |

(52) U.S. Cl.
CPC .... *H03H 9/02125* (2013.01); *H03H 9/02952* (2013.01); *H03H 9/173* (2013.01); *H03H 9/25* (2013.01); *H10D 1/68* (2025.01)

(58) Field of Classification Search
CPC .. H03H 7/38; H03H 9/02125; H03H 9/02952; H03H 9/173; H03H 9/25; H01P 1/20
See application file for complete search history.

(56) References Cited

U.S. PATENT DOCUMENTS

| | | | | |
|---|---|---|---|---|
| 2007/0215976 | A1* | 9/2007 | Degani .................. | H10D 86/01 257/E27.113 |
| 2014/0346622 | A1* | 11/2014 | Stuber ..................... | H01L 23/66 438/51 |

FOREIGN PATENT DOCUMENTS

| | | | |
|---|---|---|---|
| JP | 2020170782 | A | 10/2020 |
| JP | 2020188091 | A | 11/2020 |

* cited by examiner

FIG. 1
PRIOR ART
1a
21
11
10
FIG. 2
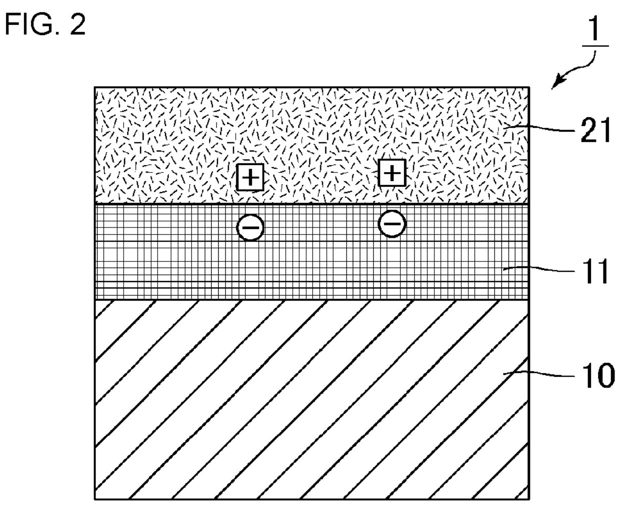
FIG. 3
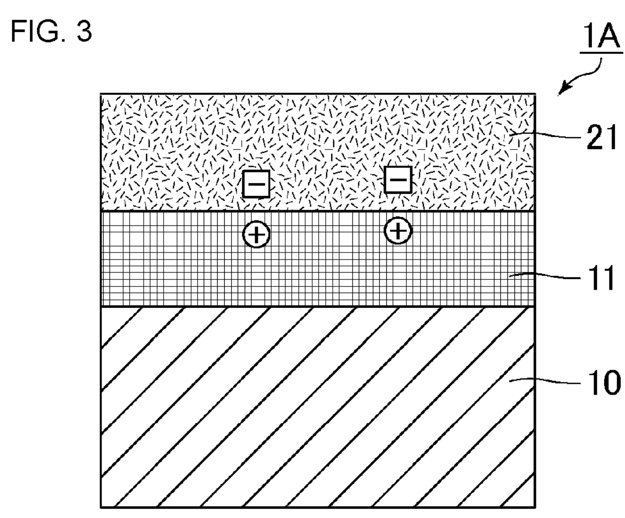

21
11
10

21
11
10
12
13
12
13

21
11
10
12
13

21
11
10
12
13

FIG. 6
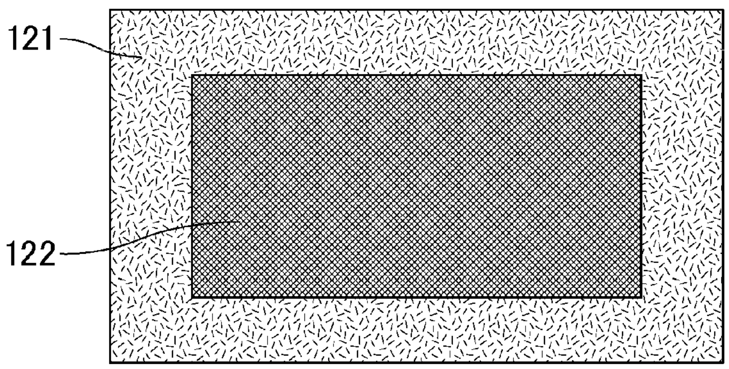
FIG. 7
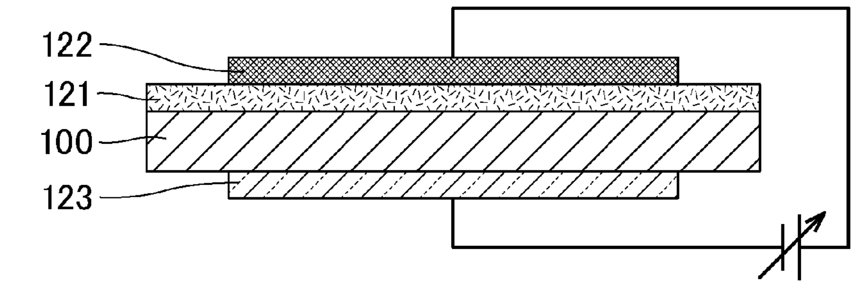
FIG. 8
CAPACITANCE C OF INSULATING LAYER
正
負
$\Delta V$
MOS CAPACITANCE
$S_0$
$S_1$
GATE VOLTAGE

SUPPORT SUBSTRATE FOR PASSIVE ELECTRONIC COMPONENT, PASSIVE ELECTRONIC COMPONENT, SEMICONDUCTOR DEVICE, MATCHING CIRCUIT, AND FILTER CIRCUIT

CROSS REFERENCE TO RELATED APPLICATIONS

The present application is a continuation of International application No. PCT/JP2022/019621, filed May 9, 2022, which claims priority to Japanese Patent Application No. 2021-079850, filed May 10, 2021, the entire contents of each of which are incorporated herein by reference.

TECHNICAL FIELD

The present invention relates to a support substrate for a passive electronic component. The present invention further relates to a passive electronic component and a semiconductor device including the support substrate and a matching circuit and a filter circuit including the semiconductor device.

BACKGROUND ART

Well-known typical capacitors used in semiconductor integrated circuits are metal-insulator-metal (MIM) capacitors, for example. An MIM capacitor is a capacitor having a parallel plate structure in which an insulator is sandwiched by lower and upper electrodes.

As a support substrate used in a passive electronic component, such as a capacitor, Patent Document 1 discloses a substrate including a planar silicon wafer, a polycrystalline silicon plane layer on the wafer, and an insulating layer on the polycrystalline silicon layer.

Patent Document 1: Japanese Unexamined Patent Application Publication No. 2007-258713

SUMMARY OF THE INVENTION

In the support substrate described in Patent Document 1, a polycrystalline silicon layer is formed between a single-crystal silicon substrate of high resistance and an insulating layer composed of $SiO_2$ or the like so as to inhibit formation of a low-resistance layer in the interface between the single-crystal silicon substrate and the insulating layer. This can reduce deterioration in Q characteristics of a passive electronic component, such as an MIN capacitor, formed on the support substrate, and more specifically, deterioration in Q characteristics due to parasitic capacitance in the high-frequency range.

FIG. 1 is a schematic diagram illustrating an example of a support substrate in the prior art. In FIG. 1, as the state of electric charge, symbols + in squares represent a positive fixed charge; symbols − in circles represent a negative mobile charge (electrons); and symbols + in circles represent a positive mobile charge.

A support substrate 1*a*, which is illustrated in FIG. 1, includes: a semiconductor substrate 10, which is a p-type single-crystal Si substrate; a charge trap layer 11, which is provided on the semiconductor substrate 10 and is composed of polycrystalline Si; and an insulating layer 21, which is provided on the charge trap layer 11 and is composed of $SiO_2$. When the insulating layer 21 is composed of $SiO_2$, the fixed charge within the insulating layer 21 is positive. As illustrated in FIG. 1, accumulated charge (electrons, herein) attracted by the fixed charge within the insulating layer 21 is trapped in the charge trap layer 11.

Patent Document 1 discloses that the insulating layer 21 is composed of an oxide, such as $SiO_2$. The insulating layer 21, which is composed of $SiO_2$, has a large amount of positive fixed charge. This produces many electrons within the charge trap layer 11, which is composed of polycrystalline Si. When the density of charge trap sites (crystal defects) in the charge trap layer 11 is insufficient, some of the produced electrons can remain untrapped. Furthermore, crystallization of polycrystalline Si proceeding due to thermal load during the device production process, changes with time, or the like similarly reduces the density of charge trap sites (crystal defects), and some of the produced electrons can remain untrapped. In this case, the deterioration in characteristics due to the parasitic capacitance can occur.

The present invention was made to solve the aforementioned problem, and an object of the present invention is to provide a support substrate for a passive electronic component in which a mobile charge produced within the charge trap layer can be reduced. Another object of the present invention is to provide a passive electronic component and a semiconductor device including the support substrate and a matching circuit and a filter circuit including the semiconductor device.

A support substrate for a passive electronic component of the present invention includes: a semiconductor substrate; a charge trap layer on the semiconductor substrate, the charge trap layer having a higher crystal defect density than the semiconductor substrate; and an insulating layer on the charge trap layer.

In a first aspect, the insulating layer is composed of silicon nitride, and an atomic concentration ratio of N to a total amount of Si and N in the insulating layer is not greater than 45 atom %.

In a second aspect, the insulating layer includes a first insulating layer on the charge trap layer and a second insulating layer on the first insulating layer, wherein a first fixed charge within the first insulating layer and a second fixed charge within the second insulating layer have opposite polarities, and the first insulating layer has a thickness of not less than 0.5 nm and not greater than 3 nm.

A passive electronic component of the present invention includes the support substrate of the present invention.

A semiconductor device of the present invention includes: the support substrate of the present invention; a first electrode layer on the support substrate; a dielectric film on the first electrode layer; a second electrode layer on the dielectric film; a protective layer covering the first electrode layer and the second electrode layer; and an outer electrode penetrating the protective layer.

A matching circuit of the present invention includes the semiconductor device of the present invention.

A filter circuit of the present invention includes the semiconductor device of the present invention.

According to the present invention, it is possible to provide a support substrate for a passive electronic component in which a mobile charge produced within the charge trap layer is reduced. According to the present invention, it is further possible to provide a passive electronic component and a semiconductor device including the support substrate and a matching circuit and a filter circuit including the semiconductor device.

BRIEF DESCRIPTION OF THE DRAWINGS

FIG. 1 is a schematic diagram illustrating a support substrate example in the prior art.

FIG. 2 is a schematic diagram illustrating an example of a support substrate according to a first embodiment of the present invention.

FIG. 3 is a schematic diagram illustrating another example of the support substrate according to the first embodiment of the present invention.

FIG. 6 is a top view for explaining a method of measuring the fixed charge.

FIG. 7 is a cross-sectional view for explaining the method of measuring the fixed charge.

FIG. 8 is a graph illustrating an example of a C-V curve.

DETAILED DESCRIPTION OF THE PREFERRED EMBODIMENTS

Figure 4:
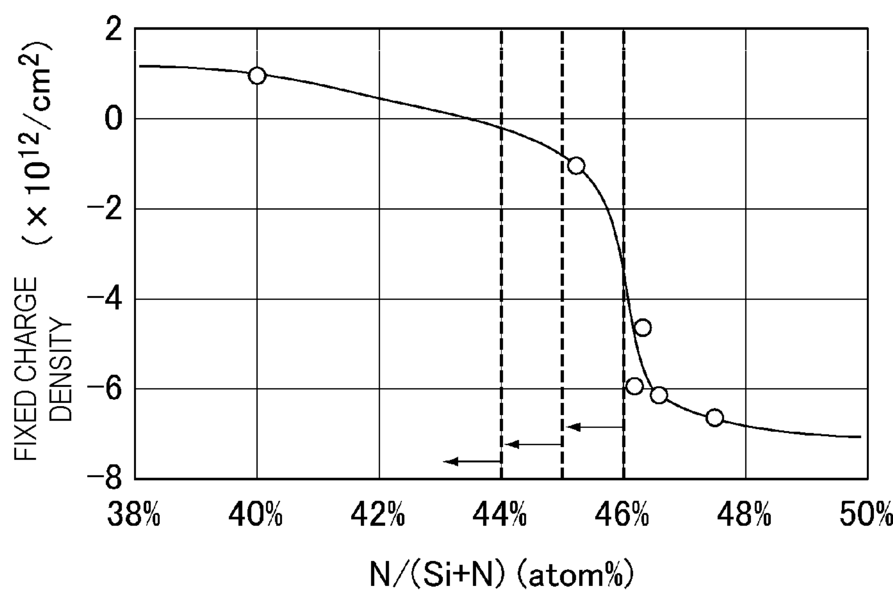
FIG. 4 is a graph illustrating the relationship between a fixed charge density and a ratio of the atomic concentration ratio of N to the total amount of Si and N in the insulating layer.

The following description is given of a support substrate for a passive electronic component (the "support substrate for a passive electronic component" is sometimes abbreviated as a "support substrate" hereinafter.) of a preferred embodiment of the present invention. However, the present invention is not limited to the following configurations and can be applied by being subjected to various changes without departing from the spirit of the present invention. The present invention also includes a combination of two or more individual preferable configurations of the present invention described below.

Each embodiment illustrated below is just an example, and it is obviously possible to substitute with each other or combine some of the configurations described in different embodiments. In a second embodiment, the same matters as those in a first embodiment are not described, and only different matters are described. Similar operations and effects obtained by similar configurations in particular are not described in every embodiment concerned.

First Embodiment

A support substrate according to the first embodiment of the present invention includes: a semiconductor substrate; a charge trap layer on the semiconductor substrate and having a higher crystal defect density than the semiconductor substrate; and an insulating layer on the charge trap layer.

In the first embodiment of the present invention, the insulating layer is composed of silicon nitride, and the atomic concentration ratio of N to the total amount of Si and N in the insulating layer is not greater than 45 atom %.

FIG. 2 is a schematic diagram illustrating an example of the support substrate according to the first embodiment of the present invention. FIG. 3 is a schematic diagram illustrating another example of the support substrate according to the first embodiment of the present invention. In FIGS. 2 and 3, symbols − in squares represent a negative fixed charge; symbols + in squares represent a positive fixed charge; symbols − in circles represent a negative mobile charge (electrons); and symbols + in circles represent a positive mobile charge.

A support substrate 1, which is illustrated in FIG. 2, includes: a semiconductor substrate 10; a charge trap layer 11 provided on the semiconductor substrate 10 and having a higher crystal defect density than the semiconductor substrate 10; and an insulating layer 21 on the charge trap layer 11. In the support substrate 1, which is illustrated in FIG. 2, the fixed charge within the insulating layer 21 is positive.

A support substrate 1A, which is illustrated in FIG. 3, includes: the semiconductor substrate 10; the charge trap layer 11 on the semiconductor substrate 10 and having a higher crystal defect density than the semiconductor substrate 10; and the insulating layer 21 on the charge trap layer 11. In the support substrate 1A, which is illustrated in FIG. 3, the fixed charge within the insulating layer 21 is negative.

In the support substrate according to the first embodiment of the present invention, the fixed charge within the insulating layer is adjusted so as to reduce the mobile charge produced in the interface between the insulating layer and the charge trap layer. Specifically, the mobile charge produced within the charge trap layer can be reduced by forming an insulating layer having a smaller fixed charge in the interface with the charge trap layer.

The aforementioned configuration can provide the following effects.

The further increased resistivity of the charge trap layer further reduces the influence of the parasitic capacitance by the semiconductor substrate.

The requirements for the performance of the charge trap layer can be relaxed. For example, the charge trap layer can be composed of materials having higher heat-resistance temperature and longer heat-resistance time, thus reducing restrictions on the method of production or the temperature at the device production process.

The semiconductor substrate is preferably a Si substrate of high resistance and is more preferably a single-crystal Si substrate.

The semiconductor substrate preferably has a resistivity of not less than 3 kΩ·cm and more preferably not less than 5 kΩ·cm.

The Si substrate, such as a single-crystal Si substrate, may be either p-type or n-type but is preferably p-type because an n-type Si substrate of high resistance is fragile and its resistance is difficult to control.

The charge trap layer having a higher crystal defect density than the semiconductor substrate traps the mobile charge produced in the interface with the insulating layer. The charge trap layer is preferably composed of a high-resistance semiconductor material, such as polycrystalline Si or amorphous Si, which includes sites that trap charge.

Preferably, the resistivity of the charge trap layer is equal to or greater than the resistivity of the semiconductor substrate.

In a region where the mobile charge exists in the charge trap layer, the density is the highest near the interface with the insulating layer and decreases with the distance from the insulating layer. The region where the mobile charge exists extends to a depth of about 1 to 2 μm. Thus, the thickness of the charge trap layer is preferably not less than 1 μm and more preferably not less than 2 μm. On the other hand, the thickness of the charge trap layer is not greater than 10 μm, for example.

Specific examples of the charge trap layer include polycrystalline Si film, amorphous Si film, a crystal-destroyed layer formed by ion implantation of rare gas into a Si surface, and a crystal-distorted layer formed by cutting or polishing. Among these, the charge trap layer is preferably composed of polycrystalline Si or amorphous Si because of the thermal stability of their film structure and easy control of their thickness. The polycrystalline Si film or amorphous Si film can be formed by using a vapor-deposition method, such as chemical vapor deposition (CVD) or sputtering.

Preferably, the fixed charge within the insulating layer is as small as possible. As described above, the typically used insulating layer composed of $SiO_2$ has a positive fixed charge, but the composition ratio of Si/O and the bonding between Si and O are difficult to control. It is thus not easy to adjust the amount of fixed charge or invert the polarity of the fixed charge as a stable film. Therefore, thermally-oxidized film in which the fixed charge can be most stably reduced has been used. However, even the thermally-oxidized film has a large amount of fixed charge. Thus, improvements have been considered for the charge trap layer.

In the first embodiment of the present invention, by adjusting the composition ratio of Si/N of the insulating layer composed of silicon nitride to change its composition from N-rich to Si-rich, the produced fixed charge can be controlled from negative to positive.

FIG. 4 is a graph illustrating the relationship between the fixed charge density and the atomic concentration ratio of N to the total amount of Si and N in the insulating layer.

In $Si_3N_4$, as a silicon nitride in stoichiometric proportions, the atomic concentration ratio of N to the total amount of Si and N is 57.2 atom %. The insulating layer composed of $Si_3N_4$ has a negative fixed charge. Based on FIG. 4, the fixed charge can be made small by setting the atomic concentration ratio of N to the total amount of Si and N in the insulating layer to not greater than 46 atom %. The fixed charge is made very small particularly when the atomic concentration ratio of N to the total amount of Si and N in the insulating layer is not greater than 45 atom %.

When the atomic concentration ratio of N to the total amount of Si and N in the insulating layer is greater than 44 atom % and not greater than 45 atom %, the fixed charge within the insulating layer is negative and is very small in magnitude. On the other hand, when the atomic concentration ratio of N to the total amount of Si and N in the insulating layer is not greater than 44 atom %, the fixed charge within the insulating layer is positive and is very small in magnitude. In order to stably set the fixed charge positive, preferably, the atomic concentration ratio of N to the total amount of Si and N in the insulating layer is set to not greater than 43 atom %. FIG. 2 described above illustrates the state of the mobile charge produced in the interface between the insulating layer and the charge trap layer when the fixed charge within the insulating layer is positive. FIG. 3 illustrates the state of the mobile charge produced in the interface between the insulating layer and the charge trap layer when the fixed charge within the insulating layer is negative.

The lower limit of the atomic concentration ratio of N to the total amount of Si and N in the insulating layer is not limited. When the atomic concentration ratio of N to the total amount of Si and N in the insulating layer is less than 38 atom %, deterioration in insulating properties increases the parasitic capacitance. This can deteriorate the Q characteristics. It is therefore preferable that the atomic concentration ratio of N to the total amount of Si and N in the insulating layer is not less than 38 atom %.

The atomic concentration ratio of N to the total amount of Si and N in the insulating layer can be calculated by analyzing the constituent elements of the insulating layer through X-ray photoelectron spectroscopy (XPS).

The measurement conditions of XPS are shown below.

Measurement apparatus: Quantes by ULVAC-PHI, Inc.

Measurement range: 100 μmφ

Measurement depth: 100 nm

The insulating layer composed of silicon nitride can be formed by using a vapor-deposition method, such as CVD or sputtering.

The thickness of the insulating layer composed of silicon nitride is preferably not less than 10 nm and not greater than 2000 nm.

FIGS. 5A to 5D are schematic diagrams illustrating states of the mobile charge when the fixed charge within the insulating layer is positive.

Figures 5A, 5B, 5C, 5D:
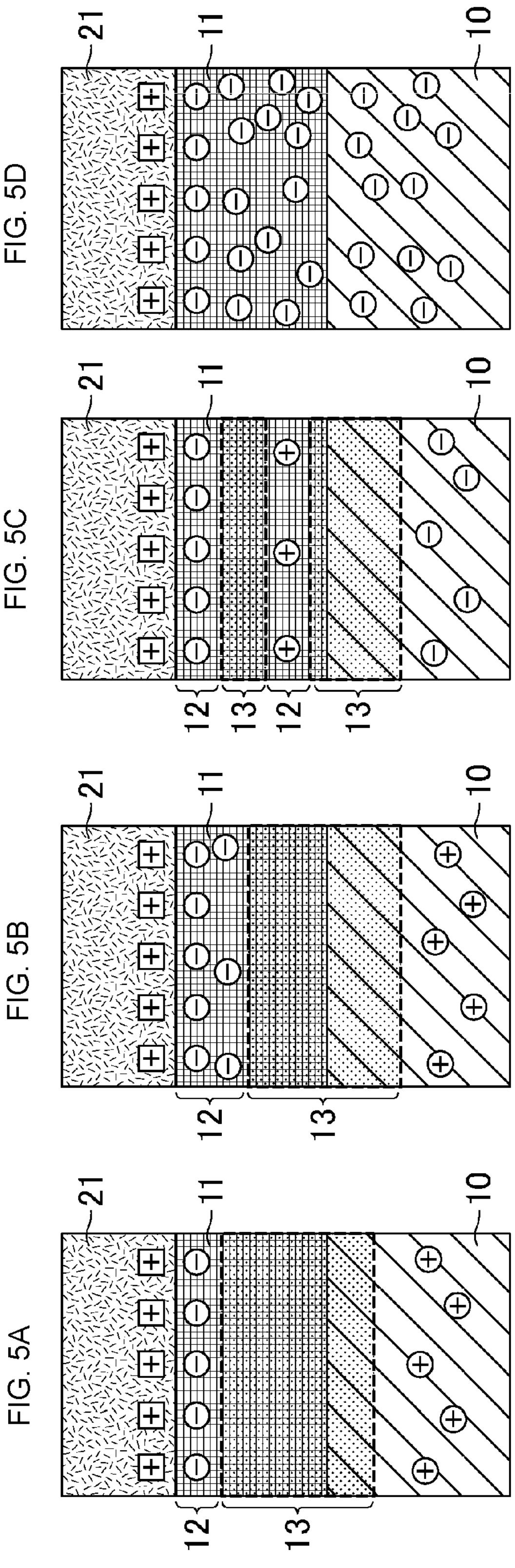
FIGS. 5A to 5D are schematic diagrams illustrating states of a mobile charge when a fixed charge within the insulating layer is positive.

As illustrated in FIGS. 5A to 5D, the effect of reducing the mobile charge depends on the combination of the conducting type of the semiconductor substrate 10, the conducting type of the charge trap layer 11, and the polarity of the fixed charge within the insulating layer 21. As illustrated in FIG. 5D, when the fixed charge within the insulating layer 21 is positive, the conducting-type of the semiconductor substrate 10 is n-type, and the conducting-type of the charge trap layer 11 is n-type, an inversion region 12 and a depletion layer 13 (see FIGS. 5A to 5C) are not formed within the charge trap layer 11, and the region of the mobile charge is extended to 5 μm or more. The mobile charge therefore cannot be accommodated within the charge trap layer 11. Part of the mobile charge leaks to the semiconductor substrate 10, forming a low-resistance region. When the fixed charge within the insulating layer 21 is positive, therefore, the combination of the conducting-type of the semiconductor substrate 10 and the conducting-type of the charge trap layer 11 is preferably a combination of p-type and p-type, p-type and n-type, or n-type and p-type, as illustrated in FIGS. 5A to 5C.

On the other hand, when the fixed charge within the insulating layer 21 is negative, the conducting-type of the semiconductor substrate 10 is p-type, and the conducting-type of the charge trap layer 11 is p-type, the inversion region 12 and the depletion layer 13 (see FIGS. 5A to 5C) are not formed within the charge trap layer 11, and the region of the mobile charge is extended to 5 μm or more. The mobile charge therefore cannot be accommodated within the charge trap layer 11. Part of the mobile charge leaks to the semiconductor substrate 10, forming a low-resistance region. When the fixed charge within the insulating layer 21 is negative, therefore, the combination of the conducting-type of the semiconductor substrate 10 and the conducting-type of the charge trap layer 11 is preferably a combination of n-type and n-type, n-type and p-type, or p-type and n-type.

As for the electric charge produced in the interface between the insulating layer 21 and the charge trap layer 11, the mobility of electrons is smaller than the mobility of holes. In operation at high frequencies, it is preferable that the electric charge produced in the interface between the insulating layer 21 and the charge trap layer 11 are holes because of the small decrease in resistance.

FIG. 6 is a top view for explaining a method of measuring the fixed charge. FIG. 7 is a cross-sectional view for explaining the method of measuring the fixed charge.

As illustrated in FIGS. 6 and 7, an insulating layer 121 is formed on one major surface of a semiconductor substrate 100, which is a Si substrate with a resistivity of not less than 1 Ω·cm and not greater than 10 Ω·cm, and an electrode 122 is formed on the insulating layer 121. Furthermore, on the other major surface of the semiconductor substrate 100, an electrode 123 is formed. Then, the C-V characteristics between the electrodes 122 and 123 are evaluated as illustrated in FIG. 7.

FIG. 8 is a graph illustrating an example of a C-V curve.

As illustrated in FIG. 8, the total amount of the fixed charge can be calculated by multiplying by a capacitance C of the insulating layer, a shift amount ΔV of a real C-V characteristic $S_1$ from an ideal curve $S_0$ obtained by C-V curve calculation. In FIG. 8, when the shift from the ideal curve $S_0$ is toward the left, the polarity of the fixed charge is positive, and when the shift from the ideal curve $S_0$ is toward the right, the polarity of the fixed charge is negative.

Total amount of fixed charge=Capacitance C of Insulating layer×Shift amount $\Delta V$ Equation 1:

Shift amount $\Delta V$ due to total amount of fixed charge=Shift amount $\Delta V_{IFC}$ due to fixed charge in interface+Shift amount $\Delta V_{OFC}$ due to fixed charge within insulating layer. Equation 2:

Second Embodiment

In the second embodiment of the present invention, the insulating layer includes a first insulating layer provided on the charge trap layer and a second insulating layer provided on the first insulating layer. The fixed charge within the first insulating layer and the fixed charge within the second insulating layer have opposite polarities. The first insulating layer has a thickness of not less than 0.5 nm and not greater than 3 nm.

Figure 9:
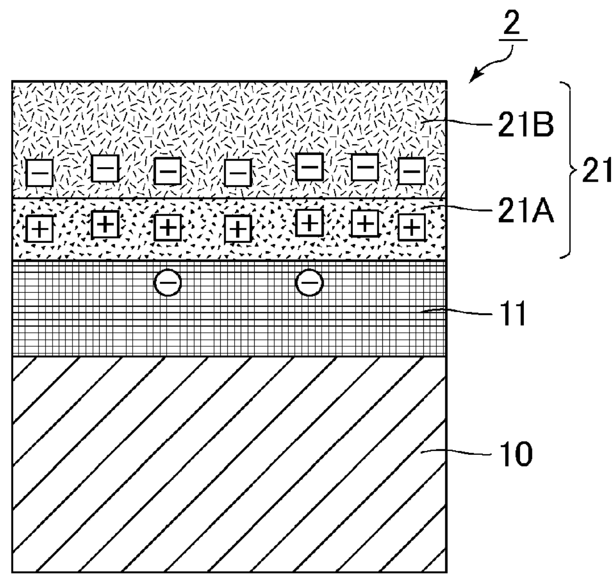
FIG. 9 is a schematic diagram illustrating an example of a support substrate according to a second embodiment of the present invention.

FIG. 9 is a schematic diagram illustrating an example of a support substrate according to the second embodiment of the present invention. In FIG. 9, symbols − in squares represent a negative fixed charge; symbols + in squares represent a positive fixed charge; and symbols − in circles represent a negative mobile charge (electrons).

The support substrate 2, which is illustrated in FIG. 9, includes: the semiconductor substrate 10; the charge trap layer 11, which is provided on the semiconductor substrate 10 and has a higher crystal defect density than the semiconductor substrate 10; and the insulating layer 21, which is provided on the charge trap layer 11. The insulating layer 21 includes a first insulating layer 21A, which is provided on the charge trap layer 11, and a second insulating layer 21B, which is provided on the first insulating layer 21A. In the support substrate 2, which is illustrated in FIG. 9, the fixed charge within the first insulating layer 21A is positive, and the fixed charge within the second insulating layer 21B is negative. That is, the fixed charge within the first insulating layer 21A and the fixed charge within the second insulating layer 21B have opposite polarities.

In the support substrate according to the second embodiment of the present invention, the insulating layer is configured to have a multilayer structure and have a small apparent fixed charge so as to reduce production of the mobile charge in the interface between the insulating layer and the charge trap layer. Specifically, the first insulating layer, which is in contact with the charge trap layer, is configured to be very thin, and the polarity of the fixed charge within the second insulating layer, which is in contact with the first insulating layer below, is configured to be opposite to that within the first insulating layer. This can reduce production of the mobile charge within the charge trap layer.

In the second embodiment of the present invention, the insulating layer can have a large fixed charge inside, and its material choices are expanded compared to the first embodiment.

The aforementioned configuration can provide the following effects.

The further increased resistivity of the charge trap layer further reduces the influence of the parasitic capacitance by the semiconductor substrate.

The requirements for the performance of the charge trap layer can be relaxed. For example, the charge trap layer can be composed of materials having higher heat-resistance temperature and longer heat-resistance time, thus reducing restrictions on the method of production or the temperature at the device production process.

The magnitude of the mobile charge produced can be accurately controlled, so that the process margin can be increased.

In the support substrate according to the second embodiment of the present invention, the configuration other than the insulating layer is the same as that of the support substrate according to the first embodiment of the present invention.

Figure 10:
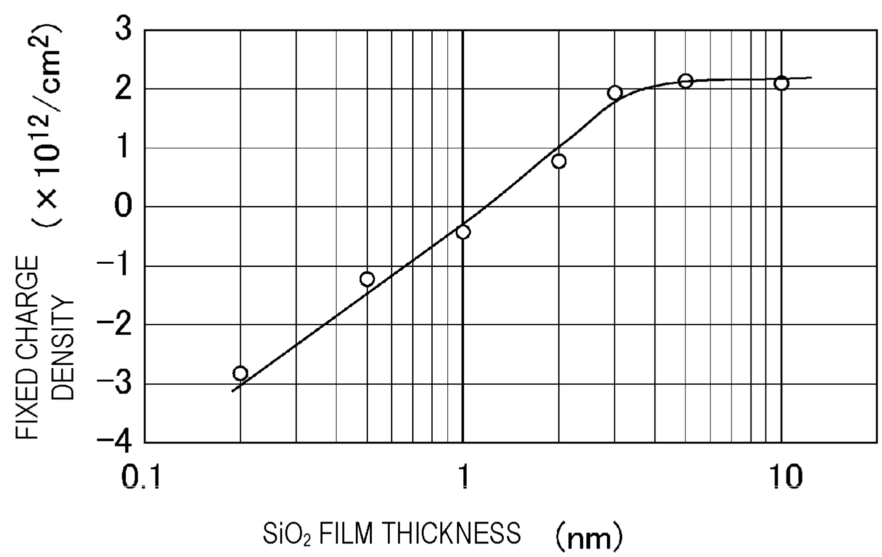
FIG. 10 is a graph illustrating the relationship in an insulating layer of a two-layer structure including a first insulating layer composed of $SiO_2$ and a second insulating layer composed of SiN, between film thickness of $SiO_2$ and the fixed charge density.

FIG. 10 is a graph illustrating the relationship in an insulating layer of a two-layer structure including a first insulating layer composed of $SiO_2$ and a second insulating layer composed of SiN, between film thickness of the $SiO_2$ and the fixed charge density. FIG. 10 illustrates composite fixed charge density (the total fixed charge density of the two layers) of the insulating layer in the interface with the charge trap layer composed of polycrystalline Si.

The apparent fixed charge in the insulating layer that affects the interface between the charge trap layer and the first insulating layer have a relationship with the thickness of the first insulating layer as illustrated in FIG. 10. Based on FIG. 10, the apparent fixed charge can be configured to be very small by setting the thickness of the first insulating layer to not less than 0.5 nm and not greater than 3 nm. Therefore, the thickness of the first insulating layer is not less than 0.5 nm and not greater than 3 nm and is preferably not less than 0.5 nm and not greater than 1.5 nm. The proper thickness of the first insulating layer depends on the magnitude of the fixed charge in the second insulating layer.

In order to minimize variation in the fixed charge, the first insulating layer is preferably composed of a material whose fixed charge is stable. Specifically, the first insulating layer is preferably composed of a compound containing Si and at least one selected from the group of O, N, F, and C or a compound containing Al and O. Preferable examples thereof are $SiO_2$, SiN, SiOF, SiOC, and $Al_2O_3$. $SiO_2$ has a positive fixed charge, and SiOF, SiOC, and $Al_2O_3$ have a negative fixed charge. SiN can have a positive or a negative fixed charge depending on the formation conditions. These materials can be formed by performing for the surface of polycrystalline Si or the like constituting the charge trap layer, thermal oxidation, plasma oxidation, plasma nitriding, plasma carbonization, a film forming process (CVD, sputtering, ALD, and vapor deposition), or the like. Among these processes, the first insulating layer is preferably formed by the surface treatment for polycrystalline Si because the surface treatment can form a stable surface by eliminating the unstable state of the native oxide of the polycrystalline Si surface.

The second insulating layer needs to be composed of a material having a fixed charge of a polarity opposite to that of the first insulating layer and is preferably SiN or $SiO_2$, for example.

The thickness of the second insulating layer is preferably not less than 3 nm. The second insulating layer having a thickness of not less than 3 nm has a certain effect. The second insulating layer is preferably thicker but is, for example, not greater than 2000 nm.

The second insulating layer can be formed by using a vapor-deposition method, such as CVD or sputtering.

The thickness of each layer, including the first and second insulating layers, can be calculated by measuring the thickness at any 10 places in a cross-section observed using a transmission electron microscope (TEM) and averaging the measurements.

When the support substrate of the present invention is used as a support substrate for a low-capacitance capacitor used in high frequencies, for example, the support substrate of the present invention can minimize the deterioration in Q characteristics due to parasitic capacitance by the semiconductor substrate in the high-frequency range. In a similar manner, when the support substrate of the present invention is used as a support substrate for a passive electronic component used in the high-frequency range, such as a surface acoustic wave element including a single-crystal piezoelectric thin film or a membrane-type bulk acoustic wave element (FBAR), the same effect as that in the capacitor can be obtained. Thus, the passive electronic component including the support substrate of the present invention is also included in the present invention.

The following description is given of specific examples of the passive electronic component including the support substrate of the present invention. The passive electronic component is a capacitor, a surface acoustic wave element, a bulk acoustic wave element, or the like, for example. The semiconductor device including the support substrate of the present invention is also included in the present invention. The semiconductor device may be a passive electronic component itself, such as a capacitor, or may be a device including a passive electronic component, such as a capacitor.

Figure 11:
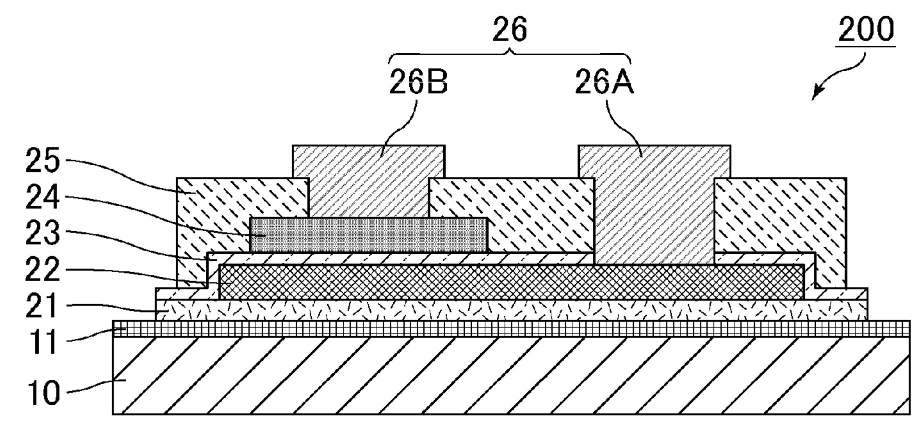
FIG. 11 is a schematic cross-sectional view of an example of a capacitor including the support substrate of the present invention.
Figure 12:
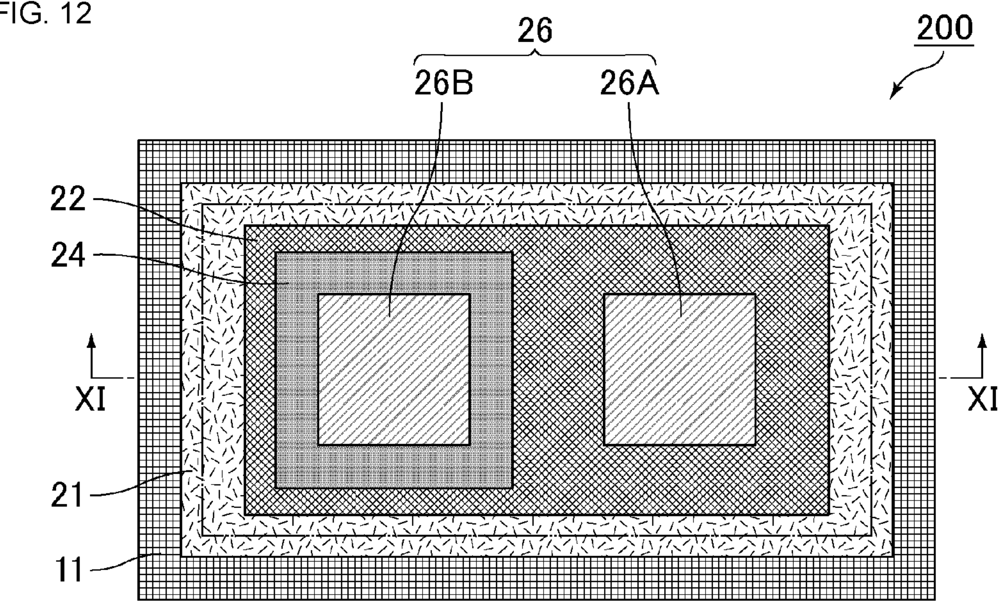
FIG. 12 is a schematic plan view of the example of the capacitor including the support substrate of the present invention.

FIG. 11 is a schematic cross-sectional view of an example of a capacitor including the support substrate of the present invention. FIG. 12 is a schematic plan view of the example of the capacitor including the support substrate of the present invention. FIG. 11 is a cross-sectional view of the capacitor illustrated in FIG. 12, taken along a line XI-XI.

A capacitor 200, which is illustrated in FIGS. 11 and 12, includes: the semiconductor substrate 10; the charge trap layer 11, which is provided on the semiconductor substrate 10 and has a higher crystal defect density than the semiconductor substrate 10; the insulating layer 21, which is provided on the charge trap layer 11; a first electrode layer 22, which is provided on the insulating layer 21; a dielectric film 23, which is provided on the first electrode layer 22; a second electrode layer 24, which is provided on the dielectric film 23; a protective layer 25, which covers the first electrode layer 22 and the second electrode layer 24; and outer electrodes 26, which penetrate the protective layer 25. The outer electrodes 26 include a first outer electrode 26A, which is coupled to the first electrode layer 22, and a second outer electrode 26B, which is coupled to the second electrode layer 24. The first outer electrode 26A penetrates the protective layer 25 and the dielectric film 23, and the second outer electrode 26B penetrates the protective layer 25.

In the capacitor 200, the semiconductor substrate 10, charge trap layer 11, and insulating layer 21 constitute the support substrate of the present invention. The configuration of the insulating layer 21 may be the configuration described in the first embodiment of the present invention or the configuration described in the second embodiment.

The first electrode layer 22 is provided away from the edge of the semiconductor substrate 10. That is, the edge of the first electrode layer 22 is positioned inside the edge of the semiconductor substrate 10.

The first electrode layer 22 is preferably composed of, but not limited to, Cu, Ag, Au, Al, Ni, Cr, Ti, an alloy containing at least one of these metals, or the like.

The dielectric film 23 is provided so as to cover the first electrode layer 22 other than an opening. The edge of the dielectric film 23 is provided on the surface of the insulating layer 21, from the edge of the first electrode layer 22 to the edge of the semiconductor substrate 10.

The dielectric film 23 is preferably composed of, but not limited to, an oxide or a nitride, such as $SiO_2$, SiN, $Al_2O_3$, $HfO_2$, or $Ta_2O_5$.

The second electrode layer 24 is provided facing the first electrode layer 22 with the dielectric film 23 interposed therebetween.

The second electrode layer 24 is preferably composed of, but not limited to, Cu, Ag, Au, Al, Ni, Cr, Ti, an alloy containing at least one of these metals, or the like.

The protective layer 25 is provided so as to cover the dielectric film 23 and the second electrode layer 24 other than the opening overlapping the second electrode layer 24. The protective layer 25 further includes an opening in the position overlapping the opening (the opening overlapping the first electrode layer 22) of the dielectric film 23. By providing the protective layer 25, the capacitor element, particularly the dielectric film 23, can be protected from moisture.

The protective layer 25 is preferably composed of, but not limited to, a resin material, such as polyimide resin or resin in the solder resist.

Between the dielectric film 23 and the protective layer 25, a moisture-resistant film may be provided. In this case, the moisture-resistant film is provided so as to cover the dielectric film 23 and the second electrode layer 24 other than the opening overlapping the second electrode layer 24 and the opening overlapping the first electrode layer 22. By providing the moisture-resistant film, the moisture resistance of the capacitor element, particularly the dielectric film 23, can be improved.

The moisture-resistant film is preferably composed of, but not limited to, a moisture-resistant material, such as $SiO_2$ or SiN.

The outer electrodes 26 are preferably composed of, but not limited to, Cu, Ni, Ag, Au, Al, or the like. The outer electrodes 26 may have either a single-layer structure or a multilayer structure. The outermost surface of the outer electrodes 26 is preferably composed of Au or Sn.

The capacitor having the aforementioned structure can be produced by a known method described in, for example, International Publication No. WO 2019/021827 or the like after the support substrate of the present invention is produced.

Figure 13:
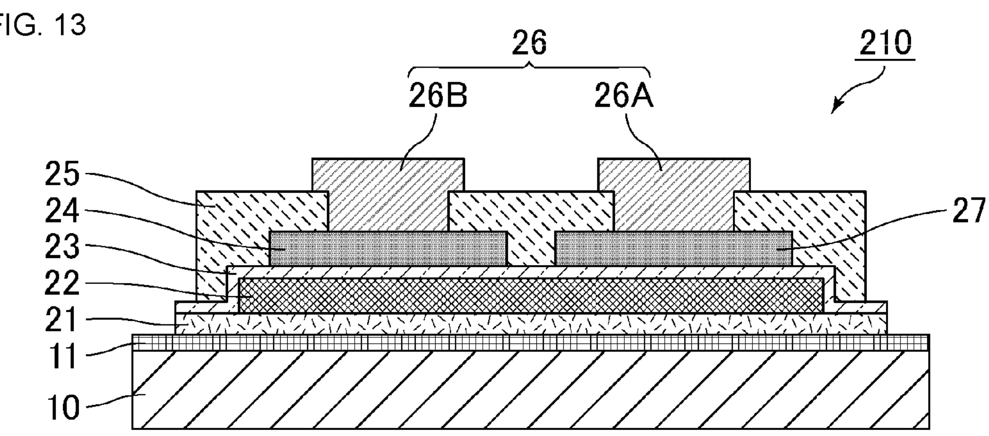
FIG. 13 is a schematic cross-sectional view of another example of the capacitor including the support substrate of the present invention.

FIG. 13 is a schematic cross-sectional view of another example of the capacitor including the support substrate of the present invention.

A capacitor 210, which is illustrated in FIG. 13, includes: the semiconductor substrate 10; the charge trap layer 11, which is provided on the semiconductor substrate 10 and has a higher crystal defect density than the semiconductor substrate 10; the insulating layer 21, which is provided on the charge trap layer 11; the first electrode layer 22, which is provided on the insulating layer 21; the dielectric film 23, which is provided on the first electrode layer 22; the second electrode layer 24, which is provided on the dielectric film 23; a third electrode layer 27, which is provided on the dielectric film 23 away from the second electrode layer 24; the protective layer 25, which covers the second electrode layer 24 and the third electrode layer 27; and the outer electrodes 26, which penetrate the protective layer 25. The outer electrodes 26 include the first outer electrode 26A, which is coupled to the third electrode layer 27, and the second outer electrode 26B, which is coupled to the second electrode layer 24. The first outer electrode 26A penetrates the protective layer 25, and the second outer electrode 26B penetrates the protective layer 25.

In the configuration of the capacitor 200, which is illustrated in FIG. 11, the capacitor is formed in the left side. In the configuration of the capacitor 210, which is illustrated in FIG. 13, capacitors are formed in respective sides. In the configuration illustrated in FIG. 13, the part in which the first outer electrode 26A is coupled to the first electrode layer 22 in the configuration illustrated in FIG. 11 is only replaced with the structure including the first electrode layer 22, the dielectric film 23, and the third electrode layer 27 laid in this order. The configuration illustrated in FIG. 13 does not require an additional space to form the element compared to the configuration illustrated in FIG. 11. It is therefore possible to produce a lower-capacitance capacitor with the same element area. Such a structure is effective when the dielectric film cannot have more than a certain thickness.

Figure 14:
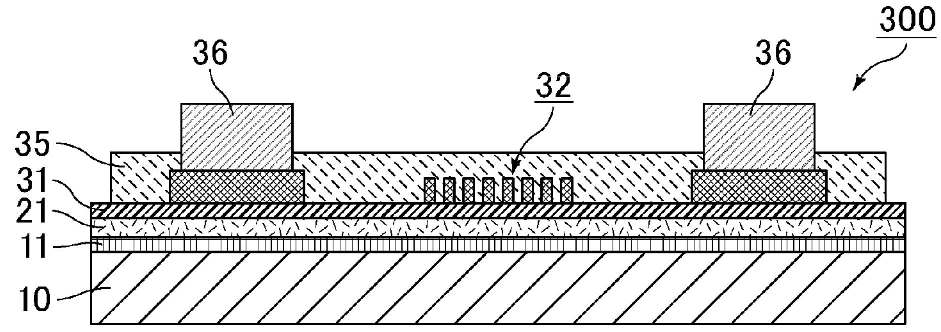
FIG. 14 is a schematic cross-sectional view of an example of a surface acoustic wave element including the support substrate of the present invention.

FIG. 14 is a schematic cross-sectional view of an example of a surface acoustic wave element including the support substrate of the present invention.

A surface acoustic wave element 300, which is illustrated in FIG. 14, includes: the semiconductor substrate 10; the charge trap layer 11, which is provided on the semiconductor substrate 10 and has a higher crystal defect density than the semiconductor substrate 10; the insulating layer 21, which is provided on the charge trap layer 11; a single-crystal piezoelectric thin film 31, which is provided on the insulating layer 21; an interdigital transducer (IDT) electrode 32, which is provided on the single-crystal piezoelectric thin film 31; a protective layer 35, which covers the IDT electrode 32; and outer electrodes 36, which penetrate the protective layer 35.

In the surface acoustic wave element 300, the semiconductor substrate 10, charge trap layer 11, and insulating layer 21 constitute the support substrate of the present invention. The configuration of the insulating layer 21 may be either the configuration described in the first embodiment of the present invention or the configuration described in the second embodiment.

Figure 15:
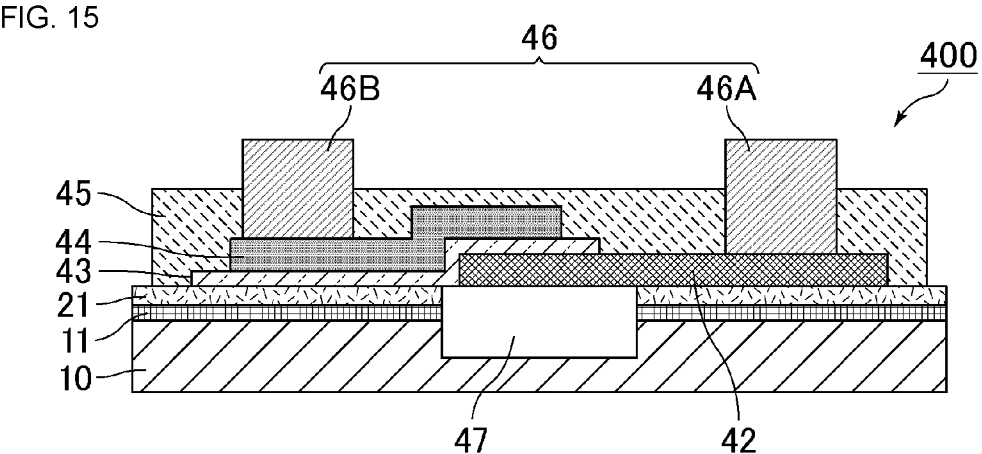
FIG. 15 is a schematic cross-sectional view of an example of a bulk acoustic wave element including the support substrate of the present invention.

FIG. 15 is a schematic cross-sectional view of an example of a bulk acoustic wave element including the support substrate of the present invention.

A bulk acoustic wave element 400, which is illustrated in FIG. 15, includes: the semiconductor substrate 10; the charge trap layer 11, which is provided on the semiconductor substrate 10 and has a higher crystal defect density than the semiconductor substrate 10; the insulating layer 21, which is provided on the charge trap layer 11; a first electrode layer 42, which is provided on the insulating layer 21; a piezoelectric film 43, which is provided on the first electrode layer 42; a second electrode layer 44, which is provided on the piezoelectric film 43; a protective layer 45, which covers the first electrode layer 42, piezoelectric film 43, and second electrode layer 44; and outer electrodes 46, which penetrate the protective layer 45. The outer electrodes 46 include a first outer electrode 46A, which is coupled to the first electrode layer 42, and a second outer electrode 46B, which is coupled to the second electrode layer 44. The first outer electrode 46A penetrates the protective layer 45, and the second outer electrode 46B penetrates the protective layer 45.

In the bulk acoustic wave element 400, which is illustrated in FIG. 15, an air gap 47 is formed in a part of the semiconductor substrate 10 under at least the region where the first electrode layer 42 overlaps the second electrode layer 44. The bulk acoustic wave element 400 thus has a so-called membrane structure.

In the bulk acoustic wave element 400, the semiconductor substrate 10, charge trap layer 11, and insulating layer 21 constitute the support substrate of the present invention. The configuration of the insulating layer 21 may be either the configuration described in the first embodiment of the present invention or the configuration described in the second embodiment.

A semiconductor device of the present invention as an example of the passive electronic component of the present invention has high Q characteristics and is suitably used as a capacitor for a matching circuit or a filter circuit. The matching circuit or filter circuit including the semiconductor device of the present invention is also included in the present invention.

Figure 16:
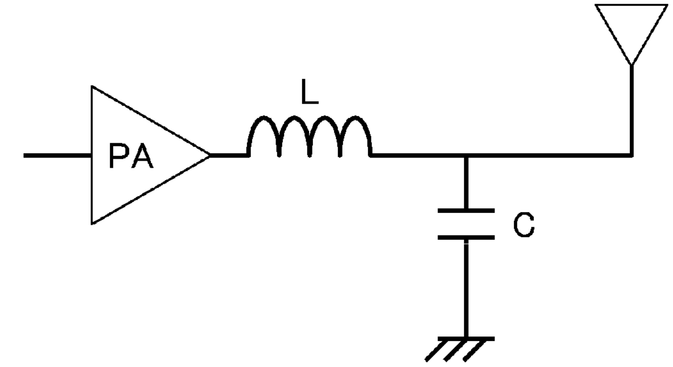
FIG. 16 is an explanatory diagram illustrating an example of a matching circuit.

FIG. 16 is an explanatory diagram illustrating an example of the matching circuit.

By using the semiconductor device of the present invention as a capacitor C in the matching circuit illustrated in FIG. 16, for example, the power consumption of the entire circuit can be minimized.

Figure 17:
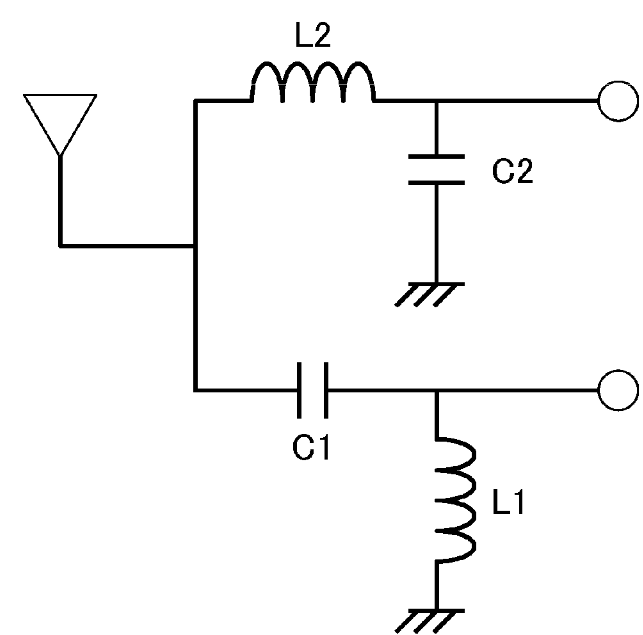
FIG. 17 is an explanatory diagram illustrating an example of a filter circuit.

FIG. 17 is an explanatory diagram illustrating an example of a filter circuit.

By using the semiconductor device of the present invention as a capacitor C1 in the filter circuit illustrated in FIG. 17, for example, the power consumption of the entire circuit can be minimized.

REFERENCE SIGNS LIST

- 1, 1A, 1*a*, 2 SUPPORT SUBSTRATE (SUPPORT SUBSTRATE FOR PASSIVE ELECTRONIC COMPONENT)
- 10, 100 SEMICONDUCTOR SUBSTRATE
- 11 CHARGE TRAP LAYER
- 12 INVERSION REGION
- 13 DEPLETION LAYER

21, 121 INSULATING LAYER
21A FIRST INSULATING LAYER
21B SECOND INSULATING LAYER
22, 42 FIRST ELECTRODE LAYER
23 DIELECTRIC FILM
24, 44 SECOND ELECTRODE LAYER
25, 35, 45 PROTECTIVE LAYER
26, 36, 46 OUTER ELECTRODE
26A, 46A FIRST OUTER ELECTRODE
26B, 46B SECOND OUTER ELECTRODE
27 THIRD ELECTRODE LAYER
31 SINGLE-CRYSTAL PIEZOELECTRIC THIN FILM
32 IDT ELECTRODE
43 PIEZOELECTRIC FILM
47 AIR GAP
122, 123 ELECTRODE
200, 210 CAPACITOR (SEMICONDUCTOR DEVICE)
300 SURFACE ACOUSTIC WAVE ELEMENT (SEMICONDUCTOR DEVICE)
400 BULK ACOUSTIC WAVE ELEMENT (SEMICONDUCTOR DEVICE)

The invention claimed is:

1. A support substrate for a passive electronic component, the support substrate comprising:
a semiconductor substrate;
a charge trap layer on the semiconductor substrate, the charge trap later having a higher crystal defect density than the semiconductor substrate; and
a silicon nitride insulating layer on the charge trap layer, wherein an atomic concentration ratio of N to a total amount of Si and N in the insulating layer is not greater than 45 atom %.

2. The support substrate according to claim 1, wherein the semiconductor substrate is a single-crystal Si substrate.

3. The support substrate according to claim 1, wherein the charge trap layer is composed of polycrystalline Si or amorphous Si.

4. The support substrate according to claim 1, wherein the atomic concentration ratio of N to the total amount of Si and N in the insulating layer is not greater than 44 atom %.

5. The support substrate according to claim 1, wherein a fixed charge within the insulating layer is positive.

6. The support substrate according to claim 5, wherein a combination of a conducting type of the semiconductor substrate and a conducting type of the charge trap layer is p-type and p-type, p-type and n-type, or n-type and p-type.

7. The support substrate according to claim 1, wherein the atomic concentration ratio of N to the total amount of Si and N in the insulating layer is greater than 44 atom % and not greater than 45 atom %.

8. The support substrate according to claim 1, wherein a fixed charge within the insulating layer is negative.

9. The support substrate according to claim 8, wherein a combination of a conducting type of the semiconductor substrate and a conducting type of the charge trap layer is n-type and n-type, n-type and p-type, or p-type and n-type.

10. A support substrate for a passive electronic component, the support substrate comprising:
a semiconductor substrate;
a charge trap layer on the semiconductor substrate, the charge trap layer having a higher crystal defect density than the semiconductor substrate;
a first insulating layer on the charge trap layer; and
a second insulating layer on the first insulating layer, wherein
a first fixed charge within the first insulating layer and a second fixed charge within the second insulating layer have opposite polarities, and
the first insulating layer has a thickness of not less than 0.5 nm and not greater than 3 nm.

11. The support substrate according to claim 10, wherein the semiconductor substrate is a single-crystal Si substrate.

12. The support substrate according to claim 10, wherein the charge trap layer is composed of polycrystalline Si or amorphous Si.

13. The support substrate according to claim 10, wherein the first insulating layer is composed of: (1) a compound containing Si and at least one selected from the group consisting of O, N, F, and C or (2) a compound containing Al and O.

14. The support substrate according to claim 10, wherein the first insulating layer is a thermal oxidation layer, a plasma oxidation layer, a plasma nitrided layer, a plasma fluorination layer, or a plasma carbonization layer.

15. The support substrate according to claim 10, wherein the second insulating layer is composed of SiN or $SiO_2$.

16. The support substrate according to claim 10, wherein the second insulating layer has a thickness of not less than 3 nm.

17. A passive electronic component comprising the support substrate according to claim 1.

18. A semiconductor device, comprising:
the support substrate according to claim 1;
a first electrode layer on the support substrate;
a dielectric film on the first electrode layer;
a second electrode layer on the dielectric film;
a protective layer covering the first electrode layer and the second electrode layer; and
an outer electrode penetrating the protective layer.

19. A matching circuit comprising the semiconductor device according to claim 18.

20. A filter circuit comprising the semiconductor device according to claim 18.

* * * * *